United States Patent [19]
Schepis et al.

[11] Patent Number: 5,646,053
[45] Date of Patent: Jul. 8, 1997

[54] METHOD AND STRUCTURE FOR FRONT-SIDE GETTERING OF SILICON-ON-INSULATOR SUBSTRATES

[75] Inventors: Dominic Joseph Schepis, Wappingers Falls; Joseph Francis Shepard, Hopewell Junction, both of N.Y.

[73] Assignee: International Business Machines Corporation, Armonk, N.Y.

[21] Appl. No.: 575,458

[22] Filed: Dec. 20, 1995

[51] Int. Cl.$^6$ ................................................ H01L 21/306
[52] U.S. Cl. ................ 437/10; 437/12; 437/62; 437/974
[58] Field of Search ................ 437/10, 61, 62, 437/12, 974

[56] References Cited

U.S. PATENT DOCUMENTS

| | | | |
|---|---|---|---|
| 4,561,171 | 12/1985 | Schlosser | 29/572 |
| 4,885,257 | 12/1989 | Matsushita | 437/11 |
| 5,194,395 | 3/1993 | Wada | 437/10 |
| 5,308,776 | 5/1994 | Gotou | 437/21 |
| 5,318,663 | 6/1994 | Buti et al. | 156/636 |
| 5,397,903 | 3/1995 | Hirose | 437/10 |
| 5,441,899 | 8/1995 | Nakai et al. | 437/24 |
| 5,443,661 | 8/1995 | Oguro et al. | 148/33.5 |
| 5,478,758 | 12/1995 | Easter | 437/10 |

OTHER PUBLICATIONS

Jablonski, et al., "Gettering of Cu and Ni Impurities in Simox Wafers", J. Electrochem. Soc., vol. 142, No. 6, Jun. 1995, pp. 2059–2066.

H. D. Chiou, et al., "Gettering of Bonded SOI Layers", Abstrat No. 194, Discrete and Materials Technology Group, Motorola, Inc. pp. 325–326.

Horiuchi, et al., "One–Decade Reduction of pn–Junction Leakage Current Using Poly–Si Interlayered SOI Structures", IEEE 1993, 34.5.1–34.5.4.

Rozgonyi, et al., "Low Temperature Impurity Gettering for Giga–Scale Integrated Circuit Technology", Journal Reprint, SRC Pub C94132, Contract 93–MJ–533, Mar. 1994.

U.S. Patent Application, Serial No. 08/575,421 Entitled: "Method and Structures for Lateral Gettering of Silicon–on–Insulator Substrates", Devendra Sadana, et al., Docket No. FI9–95–155, Filed Dec. 20, 1995.

*Primary Examiner*—Trung Dang
*Attorney, Agent, or Firm*—Susan M. Murray

[57] ABSTRACT

A method of gettering an SOI wafer from the front side of the wafer includes depositing a gettering layer, such as polysilicon, on the SOI layer and annealing the SOI wafer with the gettering layer in place. A polish stop structure, which can be deposited before or after the gettering layer, provides a means for selectively removing the gettering layer from the SOI wafer without damaging the surface or eroding the thickness of the SOI layer.

43 Claims, 5 Drawing Sheets

| FIG. 2A |
| FIG. 2B |
| --- |
| FIG. 2C |
| FIG. 2D |
| FIG. 2E |
| --- |
| FIG. 2F |
| FIG. 2G |
| FIG. 2H |

METHOD AND STRUCTURE FOR FRONT-SIDE GETTERING OF SILICON-ON-INSULATOR SUBSTRATES

FIELD

This invention relates to gettering semiconductors and more particularly relates to gettering of silicon-on-insulator semiconductor substrates.

BACKGROUND

During production of semiconductor substrates or wafers, it is commonly necessary to perform gettering to remove unwanted impurities, for example, heavy metals, from the active areas of the wafer (e.g. where circuit devices are formed). For wafers formed by conventional techniques (e.g. "bulk wafers"), for example, by the Czochralski method, a variety of effective gettering techniques have long been employed. Generally, the methods involve creating a gettering site at or near the back side of the wafer where circuit devices are not planned to be formed. For example, the back side of the wafer may be intentionally damaged by ion implantation, thereby forming crystalline defects which draw impurities from throughout the wafer. Another technique deposits a layer of metal, such as tin or lead, or polysilicon on the back side of the wafer to act as a sink for gettering.

An alternative method of producing semiconductor wafers currently being pursued in the art and referred to as Silicon On Insulator (SOI) involves the formation of a thin monocrystalline silicon film on an insulating substrate, an example of which is shown in FIG. 1. With reference to FIG. 1, the SOI wafer 100 includes a base or substrate 112, most commonly comprising silicon or another semiconductor material, an insulating layer 114, most commonly comprising silicon dioxide, and a thin film semiconductor layer 116, most commonly comprising silicon. It is the thin film semiconductor layer 116 in which circuit devices are formed. The thinness (e.g. on the order of 1000 Å) of the semiconductor layer 116 and the insulating layer beneath the semiconductor layer 116 causes device properties which result in greater switching speed and higher current drive capability than that achieved with devices formed in conventional wafers. Thus, critical to the performance and manufacturability of the devices is the ability to accurately control both the nominal thickness and the uniformity of the thickness of the semiconductor layer 116.

SOI wafers are formed by a variety of methods. A first group of methods known as Separation by Implanted Oxygen (SIMOX) involve implanting oxygen inside a silicon substrate 112 to form a buried insulating layer 114 of $SiO_2$ at a prescribed depth. After the implant, a thin silicon layer 116 is present on the $SiO_2$ layer 114. The entire wafer 100 is then subjected to a heat treatment to remove or repair defects in the thin silicon layer 116, now referred to as the SOI layer, caused by the implant. A second group of methods involves forming a surface oxide on each of two separate silicon substrates, placing the substrates one on top of the other with the surface oxides in contact, and bonding the substrates together at the junction formed by the surface oxides by an appropriate heat treatment.

Conventional metal gettering methods, as introduced above, are generally ineffective for gettering SOI wafers. Since the conventional methods getter from the back-side of the wafer, the insulating layer 116 of the SOI wafer 100 frustrates such methods by blocking movement of impurities from the SOI layer 116 to the bulk substrate 112. While for bonded SOI wafers, there is some opportunity to interpose a gettering layer between the middle oxide and SOI layers, no such interposition methods for SOI wafers formed by the SIMOX method are known.

It would be desirable to apply a gettering layer such as polysilicon to the front of an SOI wafer to overcome the problems created by the insulating layer, but removing the polysilicon selectively to the underlying monocrystalline silicon without destroying the wafer is problematical. Etching techniques are generally impractical due to a lack of available etchants having a high selectivity (e.g. on the order of 100:1) to polycrystalline silicon over monocrystalline silicon. Thus, overetching of the polysilicon layer, as is common in the art to insure complete removal of the layer being removed, is likely to result in significant and uncontrolled reduction in the thickness of the monocrystalline silicon layer as well as roughening of or damage to the surface of the monocrystalline silicon layer, thereby rendering it unsuitable for forming devices therein. Since polysilicon in direct contact with monocrystalline silicon tends to grow epitaxially, particularly at the elevated temperatures normally used for gettering, removal by selective etching becomes impractical. Similarly, polishing the polysilicon layer down to the silicon is also uncontrolled; since polysilicon is visually indistinguishable from monocrystalline silicon, the point at which the monocrystalline silicon layer is reached cannot be accurately detected.

What is needed is an improved method of gettering an SOI layer.

OBJECTS OF THE INVENTION

It is an object of the present invention to provide a method for gettering semiconductor wafers.

It is a further object of the present invention to provide a method for gettering SOI wafers.

Still a further object of the present invention is to provide a front-side method for gettering SOI wafers.

Still a further object of the present invention is to provide a front-side method for gettering SOI wafers which does not harm the top surface of the SOI layer.

Still a further object of the present invention is to provide a method of gettering SOI wafers which permits accurate control of the thickness of the SOI layer by polishing.

BRIEF DESCRIPTION OF DRAWINGS

The foregoing and other objects, aspects and advantages will be better understood from the following detailed description with references to the drawings, in which.

SUMMARY OF THE INVENTION

The method of the present invention for gettering impurities from a silicon-on-insulator (SOI) substrate method includes the steps of: providing an SOI substrate comprising a base layer, an insulating layer disposed over the base layer and a semiconductor layer disposed over the insulating layer; forming a gettering layer disposed over and in direct contact with the semiconductor layer; forming a plurality of shallow trenches extending through the semiconductor layer and disposing within the shallow trenches a polish stop structure, the polish stop structure having a thickness; annealing the substrate for enabling gettering of the impurities from the semiconductor layer to the gettering layer; and removing the gettering layer by chemical-mechanical polishing, wherein the thickness of the polish stop structure disposed in the shallow trenches is employed to determine when removal is complete. In one embodiment, the polish stop structure is provided after the gettering layer is formed. In another embodiment the polish stop structure is provided before the gettering layer is formed.

DETAILED DESCRIPTION OF PREFERRED EMBODIMENT

The preferred embodiments of the present invention are best understood by referring to FIGS. 1, 2A–2H and 3A–3H of the drawings, like numerals being used for like and corresponding parts of the various drawings.

Figure 1:
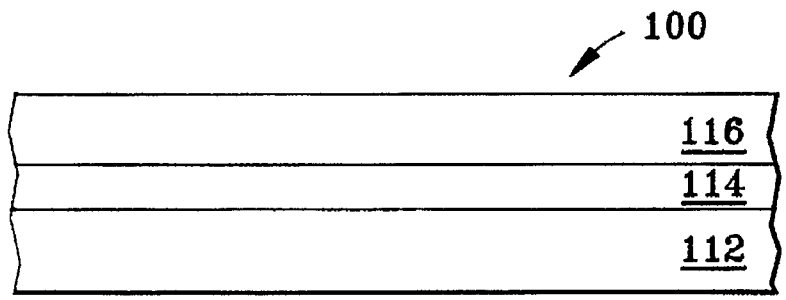
FIG. 1 is cross-section view of a conventional SOI wafer.

With reference to FIG. 1, there is shown a conventional SOI wafer 100. The wafer, which may be formed by the SIMOX or bonding methods described hereinabove, includes a base layer (or substrate) 112, an insulating layer 114 and an SOI layer 116. The base layer, provided primarily for structural support, is typically a semiconductor, preferably silicon. The insulating layer is normally silicon dioxide and is approximately 60–500 nm thick. The insulating layer alternatively comprises silicon nitride, phosphosilicate glass, borophosphosilicate glass or composite layers of silicon dioxide, silicon nitride, phosphosilicate glass and/or borophosphosilicate glass. The SOI layer 116, which is approximately 50–500 nm thick, is typically silicon, but can alternatively be silicon-germanium. The SOI layer 116, has been heat treated. In the case of an SOI wafer formed by a SIMOX method, as described hereinabove, the heat treatment serves to repair any defects created therein during preceding processing steps. In the case of an SOI wafer formed by a bonding method, the heat treatment serves to promote bonding of the two substrates. The description that follows explains how the steps of the method of the present invention can be used in subsequent processing steps upon wafer 100 to provide an effective front-side getter.

Figure 2A:
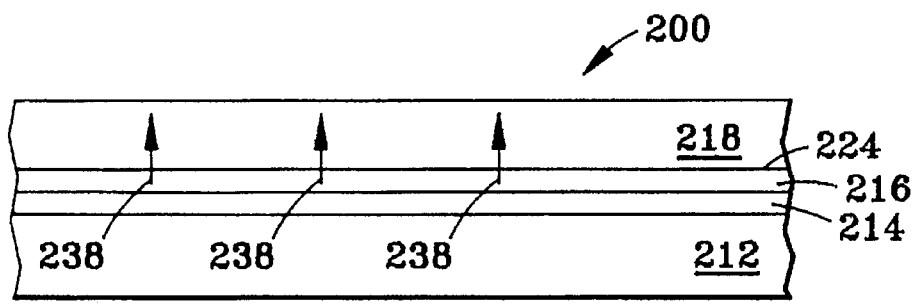
FIGS. 2A through 2H are cross-section views of an SOI wafer gettered by a first embodiment of the method of the present invention.

FIGS. 2A through 2H depict the steps of a first embodiment of the method of the present invention for gettering the SOI wafer 200. With reference to FIG. 2A, SOI wafer 200, includes the base layer (or substrate) 212, an insulating layer 214 and an SOI layer 216 formed by conventional methods as disclosed for the corresponding structures of FIG. 1. A gettering layer 218 is placed over and in direct contact with a top surface 224 of the SOI layer 216. Preferably the gettering layer comprises polysilicon and is approximately 20–500 nm thick. The polysilicon may be deposited by chemical vapor deposition (CVD) from $SiH_4$, as is known in the art.

With continued reference to FIG. 2A and with the gettering layer 218 in place, the wafer 200 is annealed for approximately 15 to 60 minutes in nitrogen at approximately 600° C. to getter metallic impurities from the SOI layer 216 to the gettering layer 218, as shown by arrows 238. The annealing time and temperature may be varied in accordance with known practices in the art. Although, for the sake of convenience and clarity, the gettering step is depicted as immediately following the deposition of the gettering layer 218, a person of ordinary skill in the art, in light of the disclosure contained herein, will observe that the step of annealing to induce gettering may be performed at any time prior to removal of the gettering layer 218.

Figure 2B:
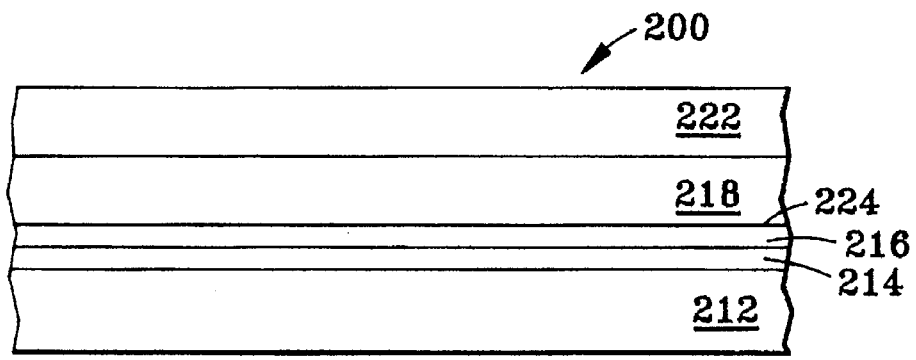

With reference to FIG. 2B, a photosensitive layer 222, which can be any commercially available photoresist, such as, for example, AZ1350, available from the Shipley Company, Inc., located in Newton, Mass., can be applied by any of a number of conventional methods (e.g. spin coated etc).

Figure 2C:
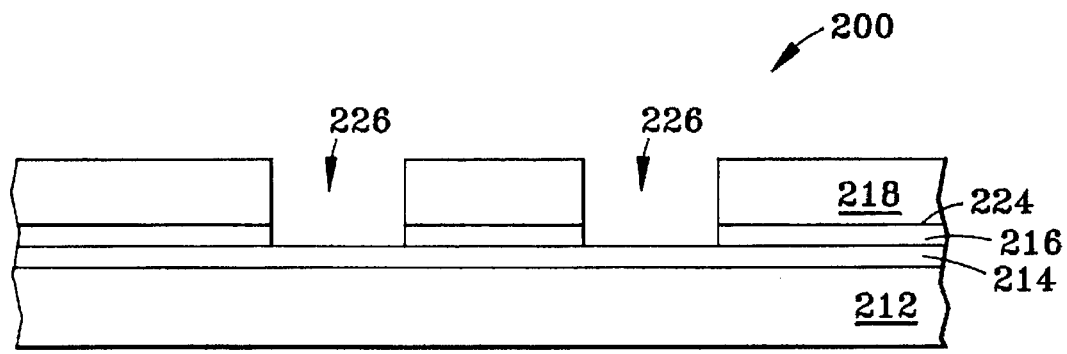

With reference to FIG. 2C, the photosensitive layer 222 may be exposed and developed in a conventional manner to form a pattern (not shown). The pattern may then be transferred to the gettering layer 218 and the SOI layer 216 by etching using an etchant having a selectivity ratio of at least approximately 3:1 for polysilicon to silicon dioxide, for example, $CCl_2$—$F_2$, if dry etching is desired. A 3:1 selectivity stops the etch once the SOI layer 216 has been removed, without significantly etching the underlying insulating region 214. Wet etchants having the appropriate selectivity may also be employed. Whether wet or dry, the etchant should preferably etch anisotropically, although isotropic etchants may also be used with some care. Shallow trenches 226, which may subsequently become isolation regions for separating active regions 236 in the SOI layer 216, have now been formed.

Figure 2D:
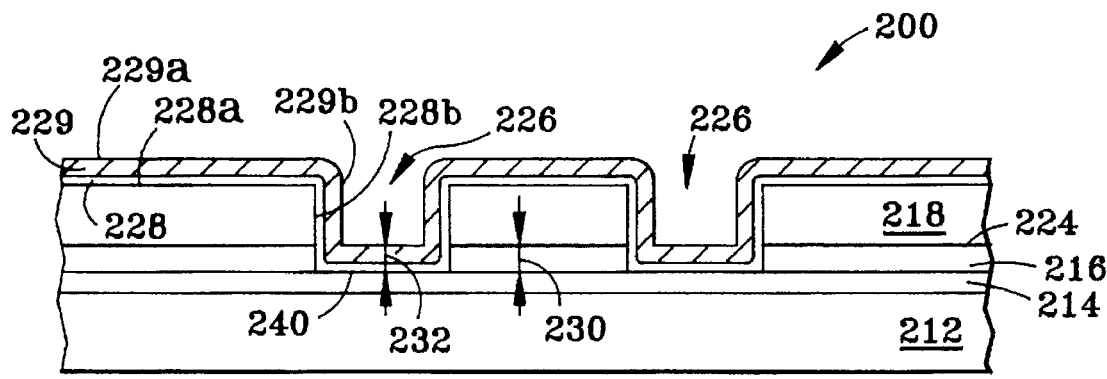

With reference to FIG. 2D, a polish stop structure 228/229 is formed. The polish stop structure 228/229 is preferably insulative and should have a top surface that is visually or otherwise distinguishable from the gettering layer 218. The polish stop structure 228/229 has substantially horizontal portions 228a and 229a and substantially vertical portions 228b and 229b and a controlled combined thickness 232 at the bottom 240 of the shallow trenches 226. The thickness 232 of the polish stop structure 228/229 determines the final thickness of the SOI layer 216, and should be equal to the desired final thickness 230 of the SOI layer 216 (e.g. in the range of 50 to 500 nm).

For example, when the gettering layer 218 is polysilicon, the polish stop structure 228/229 preferably comprises a thin conformal layer of silicon dioxide 228 (e.g. on the order of 5–10 nm) over which is disposed a conformal layer of silicon nitride 229. The silicon dioxide 228 is preferably provided to function as a buffer layer to provide stress relief for the silicon nitride, but is not essential to halting the polishing at the desired time. The silicon dioxide 228 may be thermally grown or deposited by CVD. If thermally grown, the silicon dioxide 228 will not contribute to the combined thickness 232, since the oxide will not grow over the insulating layer 214. If deposited, the silicon dioxide 228 will add to the overall thickness 232. The silicon nitride 229 may be formed by CVD from $SiH_4$ and $NH_3$ or may alternatively be formed by plasma enhanced CVD, either of which method easily provides uniform thicknesses in the desired range, within about ±5% of the thickness deposited.

Figure 2E:
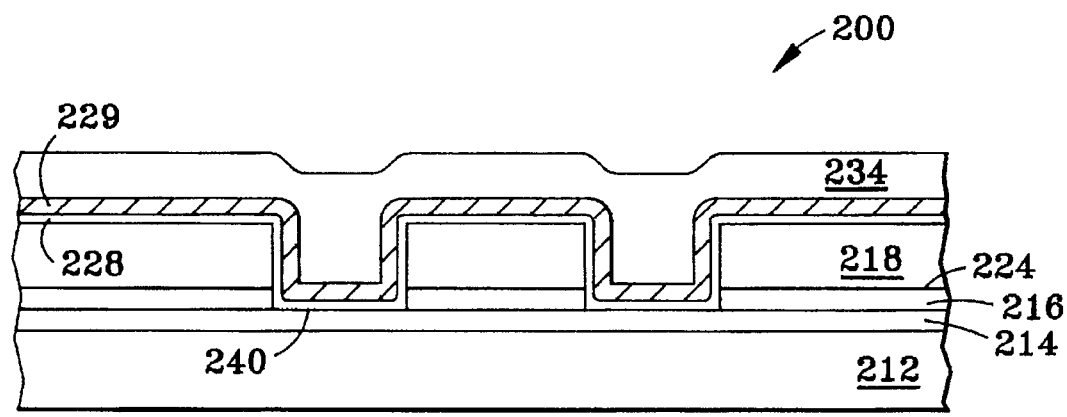

With reference to FIG. 2E, a leveling layer 234, preferably of polysilicon, is deposited over the wafer 200 to completely fill the shallow trenches 226. Filling the shallow trenches 226 helps to avoid "dishing" in the shallow trenches 226 during subsequent chemical-mechanical polishing steps. "Dishing" refers to the non-planar result observed (e.g. cup-shaped low spots) when chemical-mechanical polishing is performed on dissimilar surfaces, particularly when large surface area differences are present (e.g. the surface area of one material being polished is much greater or much lower than the surface area of another dissimilar material being polished simultaneously).

Figure 2F:
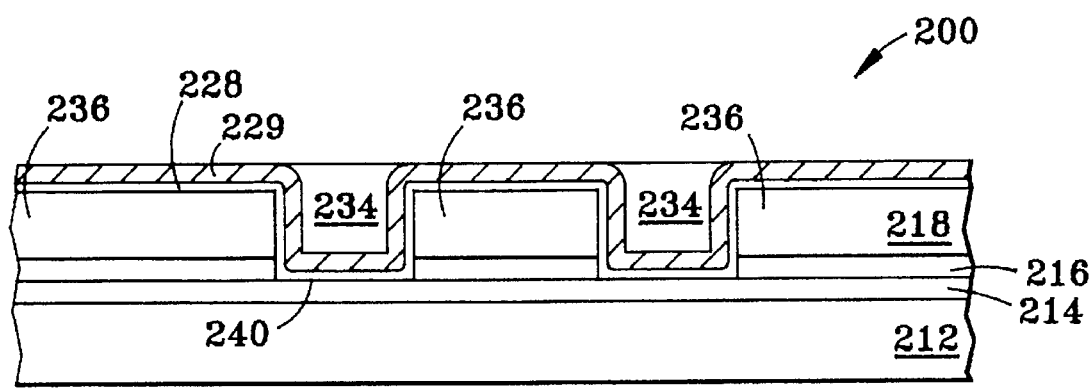

With reference to FIG. 2F, the wafer 200 is planarized by performing chemical-mechanical polishing down to the horizontal portions of silicon nitride layer 229a disposed above the active regions 236 of the SOI layer 216, thereby leaving the leveling layer 234 substantially co-planar with a top surface of the silicon nitride layer 229a. The silicon nitride layer 229a provides a visual indicator for determining when to stop the polishing.

Figure 2G:
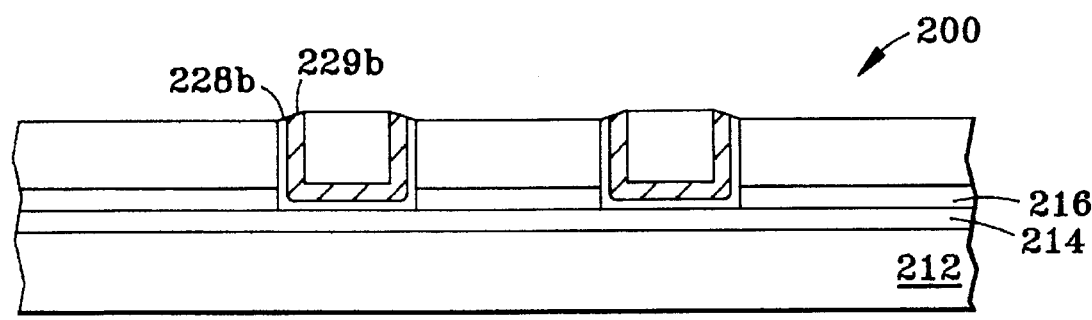
Figure 2H:
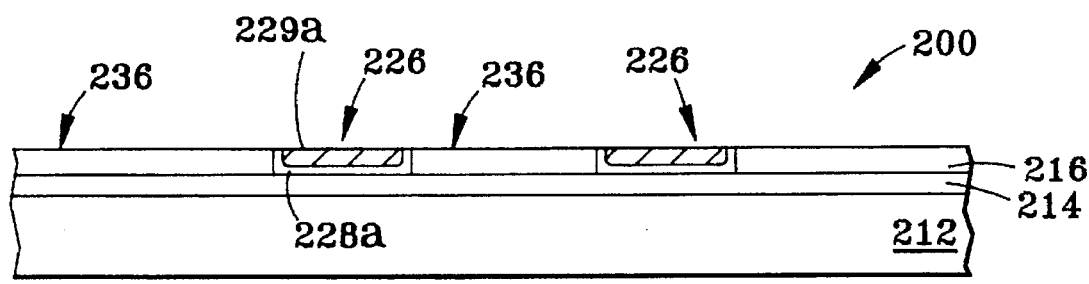

With reference to FIG. 2G, the wafer 200 is etched using and etchant having a selectivity of silicon nitride/silicon dioxide to silicon of at least approximately 3:1, for example, $CF_4$—$H_2$, in order to remove the horizontal portions of the polish stop structure 228a/229a disposed above the active regions 236, leaving the gettering layer 218 exposed. Known wet or dry etching methods may be used. It will be observed that the portion of the polish stop structure 228/229 lining the shallow trenches 226 remains intact and that the leveling layer 234 is now substantially co-planar with a top surface of the gettering layer 218.

With reference to FIG. 2H, the wafer 200 is again planarized by performing chemical-mechanical polishing, until the horizontal portions 229b of the silicon nitride layer disposed in the bottom of the shallow trench 226 are exposed, thus providing that the remaining SOI layer 216 has the same thickness as the silicon nitride 229 (and thin silicon dioxide layer 228). Thus use of the polish stop structure 228/229 allows removal of the gettering layer 218, while maintaining control over the thickness of the SOI layer and producing an SOI surface suitable for device fabrication. Because the polish stop structure 228/229 is insulative, the polish stop structure 228/229 can be left in the shallow trenches 226 as isolation regions separating the active device regions 236, thus serving dual purposes.

With reference to FIGS. 3A through 3H, a second embodiment of the method of the present invention will now be described in which embodiment the steps are similar to those disclosed with respect to FIGS. 2A through 2H but are performed in a different sequence. Where the steps are substantially the same as for the first embodiment, the details are provided hereinabove.

Figure 3A:
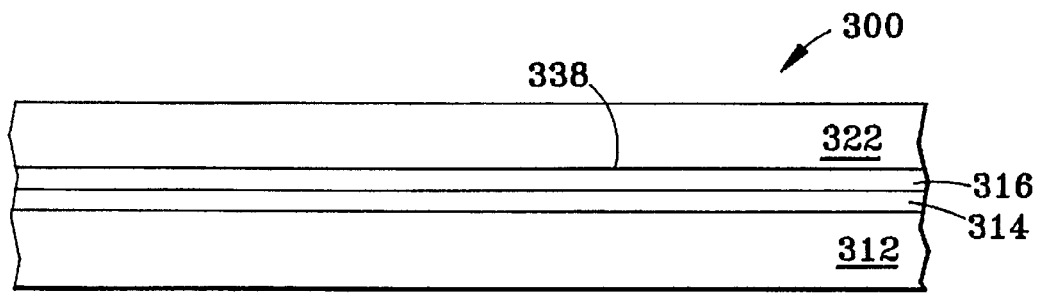
FIGS. 3A through 3H are cross-section views of an SOI wafer gettered by a second embodiment of the method of the present invention.

With reference to FIG. 3A, SOI wafer 300, including the base layer (or substrate) 312, an insulating layer 314 and an SOI layer 316 formed by conventional methods as disclosed above is provided. Photosensitive layer 322, similar to photosensitive layer 222 (FIG. 2B), is applied in a manner similar to that described above, except that it overlies the SOI layer 316, rather than the gettering layer 218 (FIG.2B).

Figure 3B:
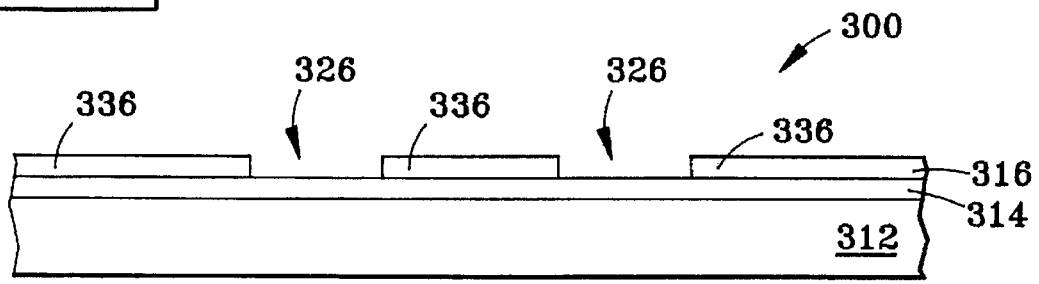

With reference to FIG. 3B, the photosensitive layer 322 is exposed and developed in a manner similar to that described with reference to FIG. 2C. This time, however, the pattern (not shown) is only transferred to the SOI layer 316 (there is no gettering layer yet). The characteristics of suitable etchants are the same as those described with reference to FIG. 2C. Thus, shallow trenches 326, which may later serve as isolation regions for separating active regions 336 in the SOI layer 316, may be formed.

Figure 3C:
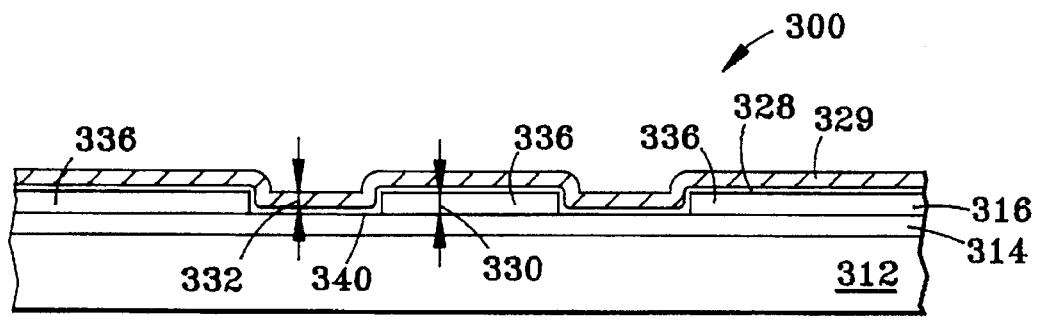

With reference to FIG. 3C, a polish stop structure 328/329 is formed. The characteristics and manner of formation of the polish stop structure 328/329 are substantially identical to the polish stop structure 228/229 disclosed in the first embodiment, except that it is formed directly over the SOI layer 316 and the insulating layer 314 (no gettering layer yet).

Figure 3D:
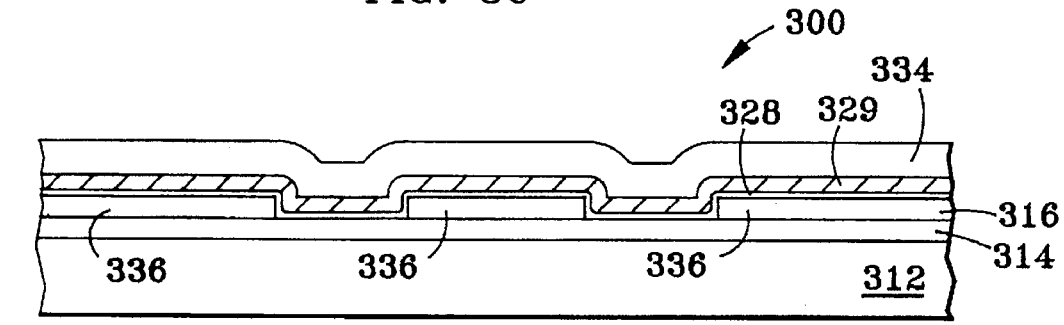

With reference to FIG. 3D, a leveling layer 334, preferably of polysilicon, is deposited over the wafer 300 to completely fill the shallow trenches 326, in a manner similar to that described above with reference to FIG. 2E. As in the case with the first embodiment, filling the shallow trenches 326 helps to avoid "dishing" in the shallow trenches 326 during subsequent chemical-mechanical polishing steps.

Figure 3E:
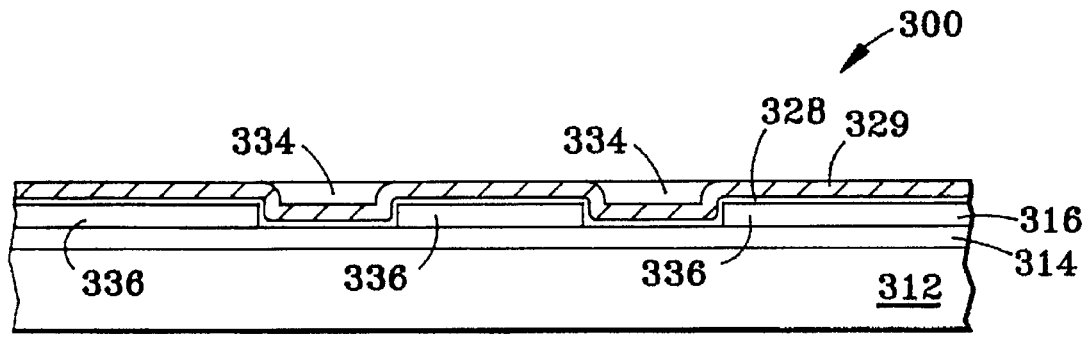

With reference to FIG. 3E, the wafer 300 is planarized by performing chemical-mechanical polishing down to the silicon nitride layer 329a disposed above the active regions 336 of the SOI layer 316, thereby leaving the leveling layer 334 substantially co-planar with a top surface of the silicon nitride layer 329a.

Figure 3F:
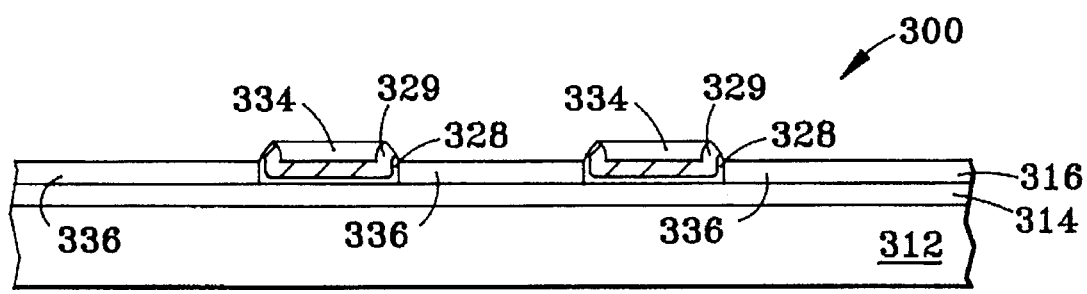

With reference to FIG. 3F, the wafer 300 is etched using and etchant having a selectivity of silicon nitride/silicon dioxide to silicon of approximately 3:1 or greater, for example, $CF_4$—$H_2$, in order to remove the portions of the polish stop structure 328a/329a disposed above the active regions 336, leaving the SOI layer 316 exposed. As with the first embodiment, other known wet or dry etchants having the appropriate selectivity may be used. It will be observed that the portion of the polish stop structure 328/329 lining the shallow trenches 326 remains intact and that the leveling layer 334 is now substantially co-planar with a top surface of the SOI 316.

Figure 3G:
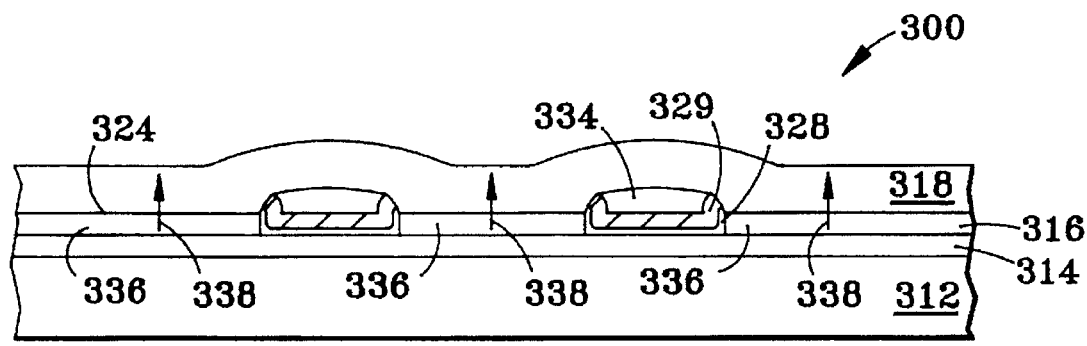
Figure 3H:
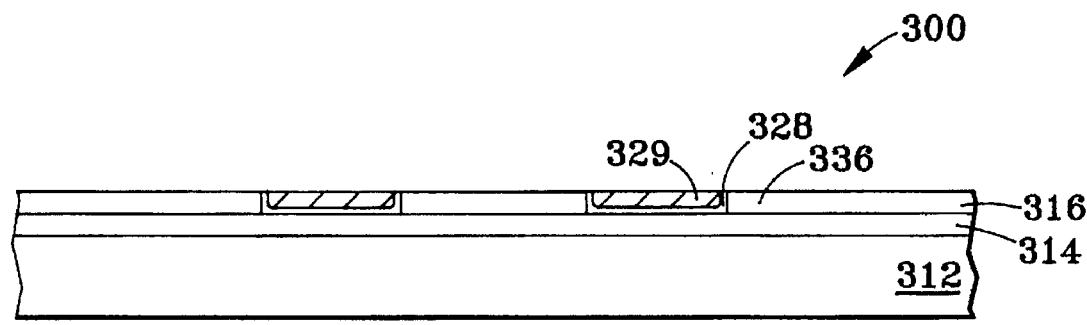

With reference to FIG. 3G, a gettering layer 318 is placed over and in direct contact with a top surface 324 of the SOI layer 316. Preferably the gettering layer 318 comprises polysilicon and is approximately 20–500 nm thick. The polysilicon may be deposited by chemical vapor deposition (CVD) from $SiH_4$, as is known in the art.

With continued reference to FIG. 3G, the wafer 300 is annealed for approximately 15 to 60 minutes in nitrogen at approximately 600° C. to getter metallic impurities from the SOI layer 316 to the gettering layer 318, as shown by arrows 338. It will be appreciated that, in contrast to the first embodiment, the annealing step for the second embodiment cannot be performed at a different point in the step sequence, since there is no available gettering layer earlier.

With reference to FIG. 3H, the wafer 300 is again planarized by performing chemical-mechanical polishing, using the polish stop structure 328 still present in the shallow trenches 326, in a manner similar to that of the first embodiment, to halt the polishing a top surface of the silicon nitride layer 329 thus establishing the final thickness of the SOI layer 316. The polish stop structure 328/329 can be left in the shallow trenches 326 to serve as isolation regions separating the active device areas 336.

The method of the present invention enjoys advantages over the prior art. First, the method provides for a top side application of a gettering layer, while maintaining the ability to accurately control the thickness of the SOI layer. Second, the gettering layer is removed in a manner which provides the SOI layer with a high quality surface, thus maintaining the ability for forming devices within the layer. Third, removal of the gettering layer eliminates the possibility of future contamination of the SOI layer from the previously gettered impurities. Fourth, the polish stop structure serves a dual purpose of accurately controlling the removal of the gettering layer and providing self-aligned isolation regions.

In light of the foregoing disclosure a person of ordinary skill in the art would understand that materials other than polysilicon may be employed as the gettering layer with appropriate modifications to the process conditions as described above. For example, tin or lead could be deposited by sputtering or evaporation in place of polysilicon and annealed at approximately 450°–600° C. Removal of the getting layer prior to chemical-mechanical polishing would then be achievable by an inorganic wet etch, such as nitric acid for lead and hydrochloric acid for tin. Alternatively, either tin or lead could be removed by a reactive ion etch or plasma etch process employing using an etchant containing halogen.

While the invention has been described in terms of a preferred embodiment, those skilled in the art will recognize that the invention can be practiced with modification within the spirit and scope of the appended claims. For example, a person of ordinary skill in the art, in light of the foregoing disclosures, would understand that materials other than polysilicon may be used as the gettering layer and the leveling layer, such as Sn or Pb, with appropriate modifications to process conditions, including deposition techniques, annealing temperatures, and etch chemistries.

What is claimed is:

1. A method for gettering impurities from a silicon-on-insulator (SOI) substrate, the method comprising the steps:

providing an SOI substrate comprising a base layer, an insulating layer disposed over the base layer and a semiconductor layer disposed over the insulating layer;

forming a gettering layer disposed over and in direct contact with the semiconductor layer;

forming a plurality of shallow trenches extending through the semiconductor layer and disposing within the shallow trenches a polish stop structure, the polish stop structure having a thickness;

annealing the substrate for enabling gettering of the impurities from the semiconductor layer to the gettering layer; and removing the gettering layer by chemical-mechanical polishing, wherein the thickness of the polish stop structure disposed in the shallow trenches is employed to determine when removal is complete.

2. The method as recited in claim 1 wherein the shallow trenches correspond to planned isolation regions.

3. The method as recited in claim 1 wherein the polish stop structure is employed to precisely control a final thickness of the SOI layer.

4. The method as recited in claim 1 wherein the gettering layer is polysilicon.

5. The method as recited in claim 1 wherein the semiconductor layer comprises silicon.

6. The method as recited in claim 1 wherein the polish stop structure provides a visual polishing stop indicator.

7. The method as recited in claim 2 wherein the polish stop structure is insulative and remains in the substrate as a self-aligned isolation region.

8. The method as recited in claim 7 wherein the polish stop structure comprises silicon nitride.

9. The method as recited in claim 7 wherein the polish stop structure comprises a first layer of silicon dioxide underlying a second layer of silicon nitride.

10. The method as recited in claim 1 wherein the step of forming the plurality of shallow trenches comprises etching.

11. The method as recited in claim 10 wherein the step of etching the plurality of shallow trenches comprises anisotropic etching.

12. The method as recited in claim 1 wherein the step of annealing comprises heating the substrate at a temperature of approximately 600° C. for approximately 15 to 60 minutes.

13. The method as recited in claim 1 further comprising a step of removing the polish stop structure.

14. A method for gettering impurities from a silicon-on-insulator (SOI) substrate, the method comprising the steps:

providing an SOI substrate comprising a base layer, an insulating layer disposed over the base layer and a semiconductor layer disposed over the insulating layer;

forming a gettering layer disposed over and in direct contact with the semiconductor layer;

annealing the substrate having formed thereon the gettering layer for enabling gettering of the impurities from the semiconductor layer to the gettering layer;

forming a plurality of shallow trenches in the substrate, the shallow trenches extending only through the gettering and semiconductor layers;

forming over the substrate a conformal polish stop structure, the polish stop structure partially filling the shallow trenches, the polish stop structure having a thickness;

forming over the polish stop structure a leveling layer, thereby completely filling the shallow trenches;

planarizing the leveling layer by chemical-mechanical polishing such that a top surface of the leveling layer is substantially planar to a top surface of exposed portions of the polish stop structure;

removing the exposed portions of the polish stop structure;

removing the gettering layer by chemical-mechanical polishing, wherein the thickness of the polish stop structure is employed to determine when removal is complete.

15. The method as recited in claim 14 wherein the shallow trenches correspond to planned isolation regions.

16. The method as recited in claim 14 wherein the polish stop structure is employed to precisely control a final thickness of the SOI layer.

17. The method as recited in claim 14 wherein the gettering layer is polysilicon.

18. The method as recited in claim 14 wherein the semiconductor layer comprises silicon.

19. The method as recited in claim 14 wherein the polish stop structure provides a visual polishing stop indicator.

20. The method as recited in claim 15 wherein the polish stop structure is insulative and remains in the substrate as a self-aligned isolation region.

21. The method as recited in claim 20 wherein the polish stop structure comprises silicon nitride.

22. The method as recited in claim 20 wherein the polish stop structure comprises a first layer of silicon dioxide underlying a second layer of silicon nitride.

23. The method as recited in claim 14 wherein the step of forming the plurality of shallow trenches comprises etching.

24. The method as recited in claim 23 wherein the step of etching the plurality of shallow trenches comprises anisotropic etching.

25. The method as recited in claim 14 wherein the step of annealing comprises heating the substrate at a temperature of approximately 600° C. for approximately 15 to 60 minutes.

26. The method as recited in claim 14 further comprising a step of removing the polish stop structure.

27. A method for gettering impurities from a silicon-on-insulator (SOI) substrate, the method comprising the steps:

providing an SOI substrate comprising a base layer, an insulating layer disposed over the base layer and a semiconductor layer disposed over the insulating layer;

forming a plurality of shallow trenches in the substrate, the shallow trenches extending only through the semiconductor layer;

forming over the substrate a conformal polish stop structure, the polish stop structure partially filling the shallow trenches, the polish stop structure having a thickness;

forming over the polish stop structure a leveling layer, thereby completely filling the shallow trenches;

planarizing the leveling layer by chemical-mechanical polishing such that a top surface of the leveling layer is substantially planar to a top surface of exposed portions of the polish stop structure;

removing the exposed portions of the polish stop structure, thereby exposing the planned active device regions of the semiconductor layer;

forming a gettering layer disposed over and in direct contact with the semiconductor layer at the planned active device regions of the semiconductor layer and the remaining portions of the polish stop structure in the shallow trenches;

annealing the substrate having formed thereon the gettering layer for enabling gettering of the impurities from the semiconductor layer to the gettering layer; and removing the gettering layer by chemical-mechanical polishing, wherein the thickness of the remaining polish stop structure is employed to determine when removal is complete.

28. The method as recited in claim 27 wherein the shallow trenches correspond to planned isolation regions.

29. The method as recited in claim 27 wherein the polish stop structure is employed to precisely control a final thickness of the SOI layer.

30. The method as recited in claim 27 wherein the gettering layer is polysilicon.

31. The method as recited in claim 27 wherein the semiconductor layer comprises silicon.

32. The method as recited in claim 27 wherein the polish stop structure provides a visual polishing stop indicator.

33. The method as recited in claim 28 wherein the polish stop structure is insulative and remains in the substrate as a self-aligned isolation region.

34. The method as recited in claim 33 wherein the polish stop structure comprises silicon nitride.

35. The method as recited in claim 33 wherein the polish stop structure comprises a first layer of silicon dioxide underlying a second layer of silicon nitride.

36. The method as recited in claim 27 wherein the step of forming the plurality of shallow trenches comprises etching.

37. The method as recited in claim 36 wherein the step of etching the plurality of shallow trenches comprises anisotropic etching.

38. The method as recited in claim 27 wherein the step of annealing comprises heating the substrate at a temperature of approximately 600° C. for approximately 15 to 60 minutes.

39. The method as recited in claim 27 further comprising a step of removing the polish stop structure.

40. A method for gettering impurities from a silicon-on-insulator (SOI) substrate, the method comprising the steps:

providing an SOI substrate comprising a base layer, an insulating layer disposed over the base layer and a semiconductor layer disposed over the insulating layer;

forming a gettering layer disposed over and in direct contact with the semiconductor layer;

annealing the substrate having formed thereon the gettering layer for enabling gettering of the impurities from the semiconductor layer to the gettering layer;

removing the gettering layer by etching;

forming a plurality of shallow trenches in the substrate, the shallow trenches extending only through the gettering and semiconductor layers;

forming over the substrate a conformal polish stop structure, the polish stop structure partially filling the shallow trenches, the polish stop structure having a thickness;

forming over the polish stop structure a leveling layer, thereby completely filling the shallow trenches;

planarizing the leveling layer by chemical-mechanical polishing such that a top surface of the leveling layer is substantially planar to a top surface of exposed portions of the polish stop structure;

removing the exposed portions of the polish stop structure;

thinning the semiconductor layer by chemical-mechanical polishing, wherein the thickness of the polish stop structure is employed to determine when thinning is complete.

41. The method as recited in claim 40 wherein the getting layer is selected from the group comprising: tin and lead.

42. A method for gettering impurities from a silicon-on-insulator (SOI) substrate, the method comprising the steps:

providing an SOI substrate comprising a base layer, an insulating layer disposed over the base layer and a semiconductor layer disposed over the insulating layer;

forming a plurality of shallow trenches in the substrate, the shallow trenches extending only through the semiconductor layer;

forming over the substrate a conformal polish stop structure, the polish stop structure partially filling the shallow trenches, the polish stop structure having a thickness;

forming over the polish stop structure a leveling layer, thereby completely filling the shallow trenches;

planarizing the leveling layer by chemical-mechanical polishing such that a top surface of the leveling layer is substantially planar to a top surface of exposed portions of the polish stop structure;

removing the exposed portions of the polish stop structure, thereby exposing the planned active device regions of the semiconductor layer;

forming a gettering layer disposed over and in direct contact with the semiconductor layer at the planned active device regions of the semiconductor layer and the remaining portions of the polish stop structure in the shallow trenches;

annealing the substrate having formed thereon the gettering layer for enabling gettering of the impurities from the semiconductor layer to the gettering layer;

removing the gettering layer by etching; and thinning the semiconductor layer by chemical-mechanical polishing, wherein the thickness of the remaining polish stop structure is employed to determine when thinning is complete.

43. The method as recited in claim 42 wherein the getting layer is selected from the group comprising: tin and lead.

* * * * *